(12) United States Patent
Buschmann

(10) Patent No.: US 7,635,829 B2
(45) Date of Patent: Dec. 22, 2009

(54) FUNCTION-SUPERVISING DEVICE

(75) Inventor: Martin Buschmann, Neustadt (DE)

(73) Assignee: Joseph Voegele AG, Manheim (DE)

( * ) Notice: Subject to any disclaimer, the term of this patent is extended or adjusted under 35 U.S.C. 154(b) by 320 days.

(21) Appl. No.: 11/634,015

(22) Filed: Dec. 4, 2006

(65) Prior Publication Data
US 2007/0138164 A1    Jun. 21, 2007

Related U.S. Application Data

(63) Continuation-in-part of application No. 11/025,862, filed on Dec. 29, 2004, now abandoned.

(30) Foreign Application Priority Data

Jan. 22, 2004    (DE) ................. 10 2004 003 356

(51) Int. Cl.
*H05B 1/02*    (2006.01)
(52) U.S. Cl. ............... 219/506; 219/483; 219/501; 219/481; 369/112.02
(58) Field of Classification Search ............ 219/481, 219/483–487, 499, 501, 507, 508; 369/112.05; 307/38–42
See application file for complete search history.

(56) References Cited

U.S. PATENT DOCUMENTS

| | | | |
|---|---|---|---|
| 4,090,062 A | * | 5/1978 | Phillips et al. ............... 219/486 |
| 5,356,238 A | | 10/1994 | Musil et al. |
| 5,521,850 A | * | 5/1996 | Moe et al. ............... 700/299 |
| 6,334,735 B1 | * | 1/2002 | Williams et al. ............ 404/79 |

FOREIGN PATENT DOCUMENTS

| | | |
|---|---|---|
| DE | 22 64 357 C2 | 7/1974 |
| DE | 135 965 A1 | 6/1979 |
| DE | 40 26 894 C1 | 11/1991 |
| DE | 195 09 778 A1 | 3/1996 |
| DE | 19537691 | 4/1996 |
| DE | 197 02 922 A1 | 7/1998 |
| EP | 1036883 | 9/2000 |
| JP | 4-58160 A1 | 2/1992 |

* cited by examiner

*Primary Examiner*—Mark H Paschall
(74) *Attorney, Agent, or Firm*—Darby & Darby P.C.

(57) ABSTRACT

A road finisher has a terminal box from which an electric supply circuit originates to supply electric current to at least one electric heating element for heating work components. A device for supervising the function of the at least one electric heating element includes an induction coil at the terminal box to sense current in the supply circuit and an indicator circuit, preferably of a light emitting diode, is connected to the induction coil for detecting and indicating a voltage induced in the induction coil by the current flowing in the supply circuit of a heating element. In a preferred embodiment, a cable gland is attached to the control box through which a current supply wire of the electric supply circuit passes, and an induction coil is located in the cable gland to sense the current in the supply wire.

9 Claims, 4 Drawing Sheets

FUNCTION-SUPERVISING DEVICE

RELATED APPLICATION

This application is a continuation-in-part application of Ser. No. 11/025,862, filed Dec. 29, 2004.

FIELD OF THE INVENTION

The invention relates to a device for supervising the function of an electric consumer connected in a supply circuit, said electric consumer being in particular a heating unit in a road finisher.

BACKGROUND OF THE INVENTION

Road finishers are provided with a large number of heating elements and heating units which heat a great a great variety of work components that come into contact with the heated paving material for producing road surfaces, so as to avoid, on the one hand, premature cooling of said paving material and so to prevent, on the other hand, the paving material from solidifying on and adhering to the cold surfaces of the respective work component. These heating units must be supervised so as to guarantee in any case that the predetermined temperature of the work component is reached and maintained. U.S. Pat. No. 6,334,735, for example, discloses an automatically controlled heating system for a road finisher in which a control system is used, which automatically adjusts the flow of current through the heating element so as to regulate the temperature. For supervising the heating unit and the temperature produced by said heating unit, at least one temperature sensor is used. A temperature sensor, especially when used in the manner described, is, however, unable to satisfactorily supervise each individual heating unit, especially each individual heating rod in a heating unit, so as to find out whether the heating rod in question is faulty or whether it works correctly. It can only be detected whether the heating unit in its entirety is able to reach and maintain the desired temperature.

A faulty heating unit could, however, be repaired much more easily, if it were possible to find out immediately that one of the heating rods is faulty and which one it is.

BRIEF DESCRIPTION OF THE INVENTION

It is therefore the object of the present invention to provide a device for supervising the function of an electric consumer, which permits each individual consumer to be easily supervised at a reasonable price and in a reliable manner.

This object is achieved by a device for supervising the function of an electric consumer, in particular a heating unit in a road finisher, connected in a supply circuit, said device comprising an induction coil which is associated with the consumer (2) and which is connected to means for detecting and indicating a voltage induced in the coil by the supply current.

By means of the embodiment according to the present invention it is possible to detect in each individual supply circuit, without major expense being incurred, whether current flows in the respective circuit. Induction coils can be provided and installed easily and they are robust in operation so that functions can be supervised reliably by them.

Advantageous further developments of the present invention can be gathered from the subclaims.

It will be particularly advantageous, when a light emitting diode is used as an indicator means, said light emitting diode defining in connection with the induction coil a passive system which does not have a supply voltage of its own.

In combination with a rectifier circuit, the device according to the present invention, which includes an induction coil and a light emitting diode, is also suitable for consumers which are operated with alternating current or a three-phase current.

By means of a measurement device which is connected to the induction coil, it is additionally possible to obtain precise measurement data and to display them directly or in a processed form.

The device according to the present invention is primarily suitable for supervising the function of heating elements and heating rods in a road finisher, in view of the fact that the device according to the present invention is very robust and reliable; it can, however, also be used for supervising the function in any other electric consumer.

BRIEF DESCRIPTION OF THE DRAWINGS

In the following, an embodiment of the present invention will be explained in detail making reference to the drawings, wherein.

DETAILED DESCRIPTION OF THE INVENTION

Figure 1:
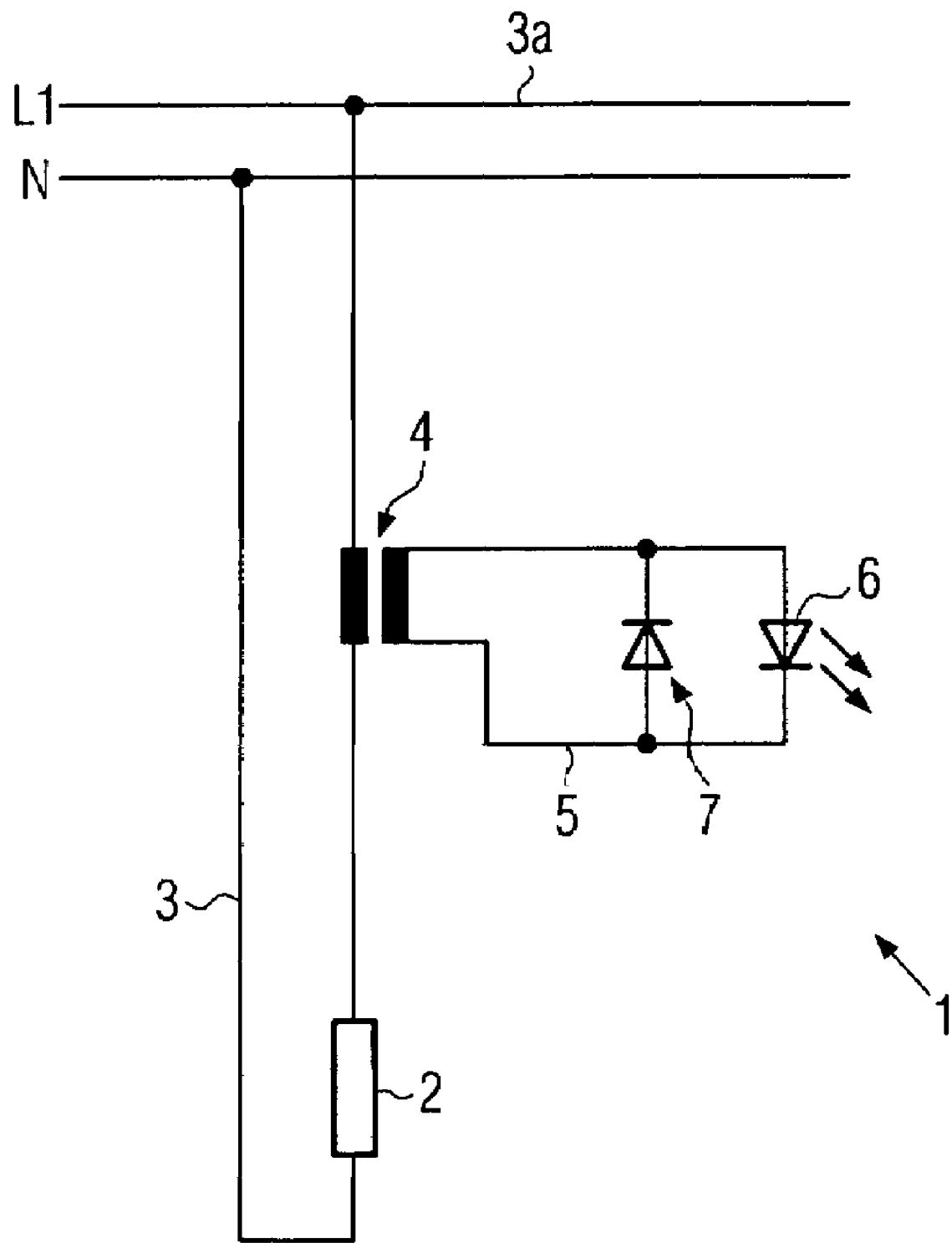
FIG. 1 shows a circuit diagram of a device according to the present invention.

FIG. 1 shows an only schematically indicated device 1 for supervising the function of an electric consumer 2 supplied with electric power via a supply circuit 3 (230V). The consumer 2 is preferably a single heating element or a heating rod within a heating circuit 3a for heating work components of a road finisher, i.e. for heating the various parts of a paving screed or the like. The consumer 2 has associated therewith simple means for current/voltage measurement, which are implemented as an induction coil 4. In the embodiment shown, the induction coil 4 is directly integrated in the supply circuit 3, but it may also be associated with e.g. the heating spiral of the consumer 2. The induction coil 4 supplies an indicator circuit 5 with electric power, said indicator circuit having arranged therein means for detecting and indicating the flow of a current in the form of a light emitting diode 6. It follows that, when a current flows in the supply circuit 3, the light emitting diode 6 will emit light. When an alternating current or a three-phase current flows in the supply circuit 3, as is normally the case in heating units used in road finishers, the indicator circuit 5 comprises a rectifier circuit 7 with a further oppositely connected diode or a resistor for the second half-wave.

When the device is in operation, a voltage is induced in the coil 4 by the alternating voltage in the supply circuit 3 and/or in the area of the heating wire of the consumer 2; said voltage is converted into a signal in a unit, e.g. in the LED 6 shown, i.e. the LED 6 will emit light. If the current supply is interrupted, the induction effect will cease and the indicator, e.g. the LED, will go out.

The device 1 according to the present invention may additionally also be provided with a circuit which is capable of evaluating different voltage/current levels.

It is also possible to provide a measurement device by means of which a flow of current is not only detected but also measured; in this case, the measurement data can either be indicated directly or they can be processed, like the simple YES- or NO-signals, so as to obtain instructions (e.g. "heating X out of order") or other indicative signals.

As a modification of the embodiment described and shown hereinbefore, other suitable means for detecting and indicating a flow of current, preferably means which do not require an additional supply voltage, can be used.

Figure 2:
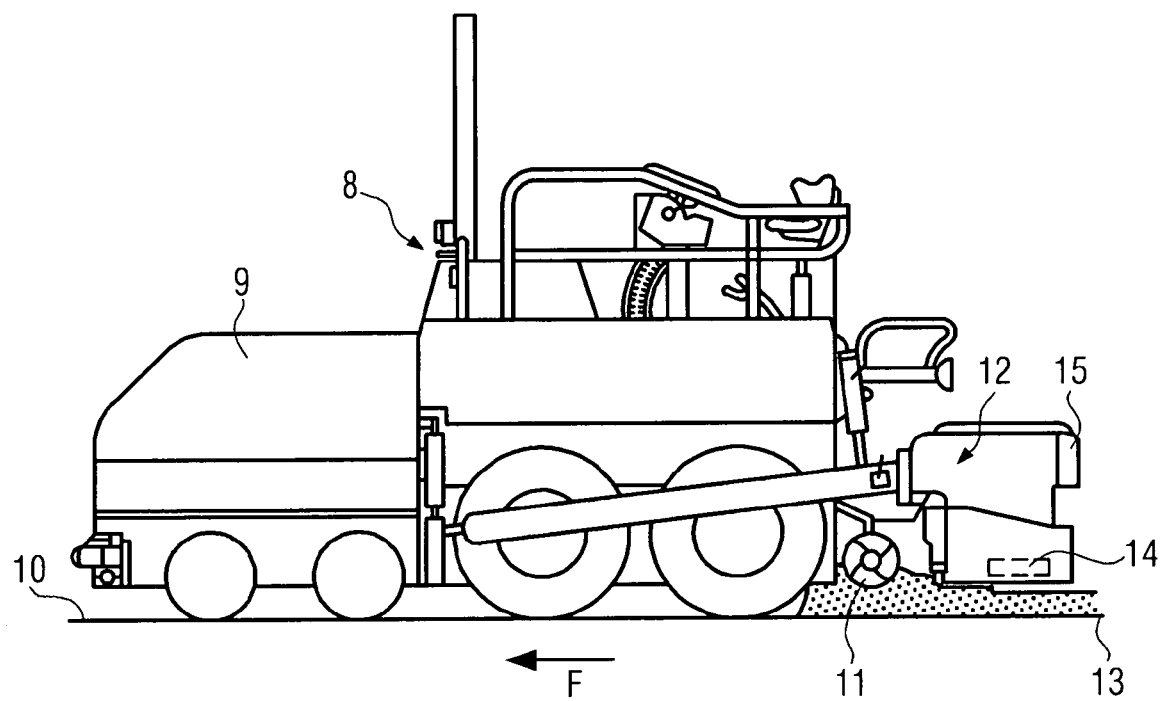
FIG. 2 shows a road finisher.

FIG. 2 shows a schematically indicated road finisher 8. The road finisher 8 comprises a vehicle 9 driven to move on a plane 10 in the direction of arrow F. On the rear side of the vehicle 9 a distribution screw 11 is arranged for distributing hot paving material over the complete working width of the road finisher 8. Following the distribution screw a paving screed 12 is arranged which compacts the paving material to form the road surface 13. The paving screed 12 includes heating means 14 arranged adjacent the lower portion of the paving screed to prevent premature cooling of the paving material before the road surface 13 has been finished as desired.

The heating means 14 includes at least one, but preferably a plurality of heating elements or heating rods. Each heating element or heating rod is connected to a terminal box 15, preferably mounted to the paving screed 12 of the road finisher in a position for reliable access to the worker.

Figure 3:
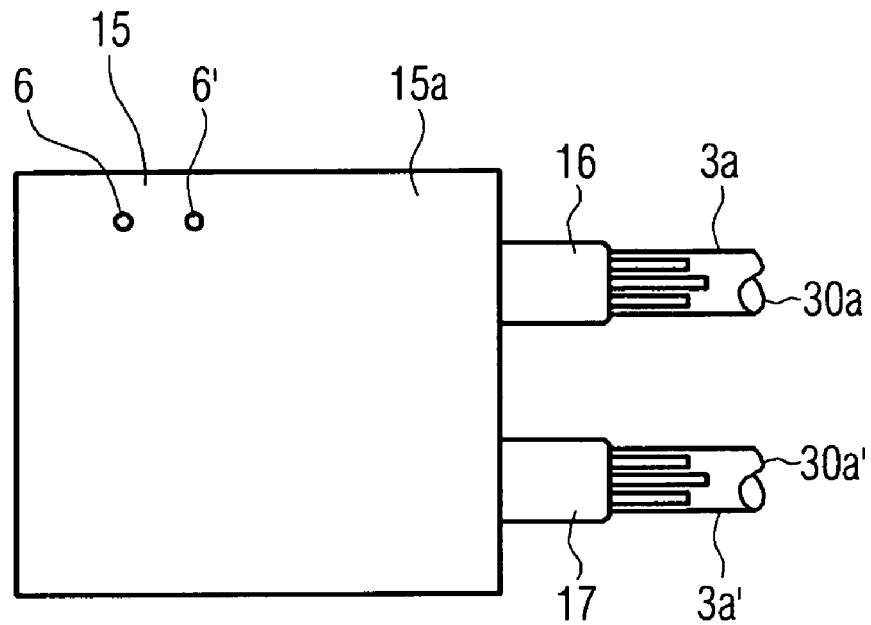
FIG. 3 shows a terminal box according to the present invention.

As shown in FIG. 3, the terminal box 15 is adapted to connect two heating circuits 3a and 3'a of two heating elements by means of cables 30a and 30'a, respectively. The heating circuits 3a and 3'a of each of the heating elements or heating rods are connected to the terminal 15 by a mounting means of the cable, especially a screwable cable gland or grommet 16 and 17, respectively.

Each of the cable glands 16, 17 are identical to each other.

Figure 4:
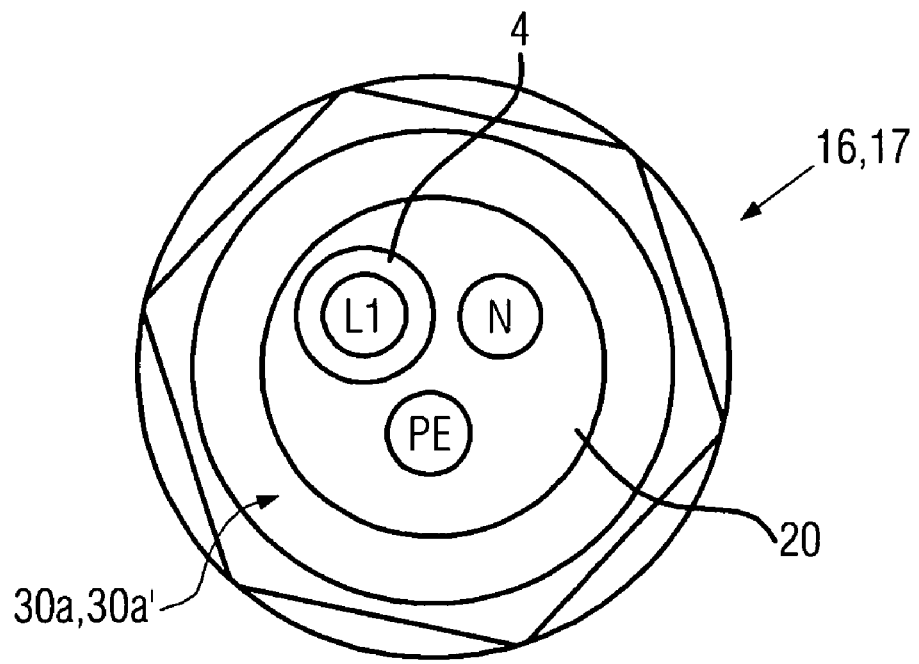
FIG. 4 shows a plan view of a cable gland.
Figure 5:
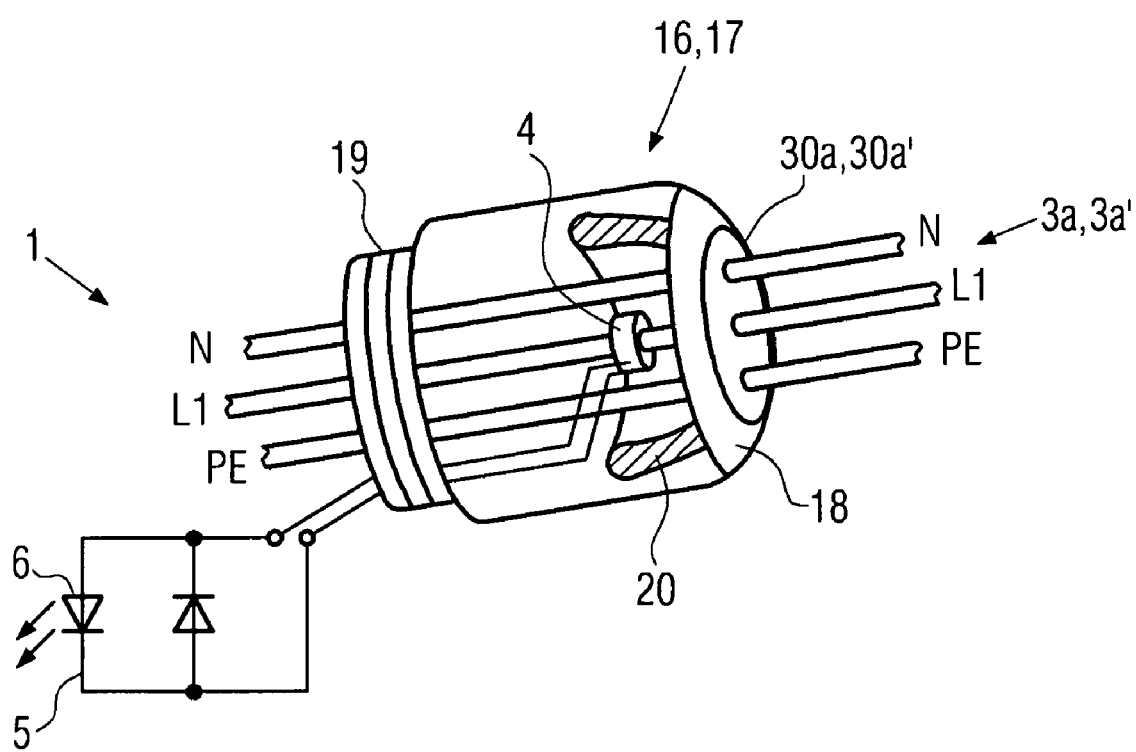
FIG. 5 shows a cable gland of the present invention with parts cutaway.

As seen from the plan view of FIG. 4 and the partially cutaway view of FIG. 5 each cable gland includes a housing 18 provided with a threaded portion 19 to be mounted to the terminal 15 by threading. Through the housing 18 the heating circuit 3a, 3'a including the three conductors L1, N and PE extend. Within the housing 18 a sealing plug 20 is arranged for sealing the interior of the housing 18 against moisture and dust. The plug 20 includes a common bore for all conductors or a separate bore for each conductor. In one of these bores the induction coil 4 of the supervision device 1 is arranged on one of the connectors, in the present case connector L1. The coil 4 is made of copper or the like material. The induction coil 4 preferable circumscribes conductor L1.

The induction circuit 5 can be provided within the grommet housing 18, or can be provided within the terminal box 15, preferably on the removable cover 15a. The light emitting diode 6 is preferably arranged on the outside of the terminal box for reliable supervision of its function. In the present case two light emitting diodes 6 and 6' are arranged, one for each heating element to be supervised. If the terminal box 15 connects only one or more than two heating elements, again, for each heating element a cable mounting means or cable gland, a supervising device and a light emitting diode is to be provided.

Moreover, a plurality of terminal boxes can be mounted to the paving screed to avoid long cables. Furthermore, the screwed cable gland can itself be provided with means for detecting and indicating a flow of current, for instance the light emitting diode.

The foregoing embodiments demonstrate methods and devices implemented and contemplated by the inventors in making and carrying out the invention. While the invention has been particularly shown and described with reference to the preferred embodiments thereof, the embodiments are not intended to be exhaustive or to limit the invention to the precise forms disclosed herein. It will be understood by those skilled in the art that various changes in form and detail may be made therein without departing from the spirit and scope of the invention. Numerous equivalent methods, devices, and techniques may be employed to achieve the same result. Similarly, any process steps described may be interchangeable with other steps in order to achieve the same result. It is intended that the scope of the invention is defined by the following claims and their equivalents.

I claim:

1. A road finisher comprising:
   a terminal box;
   an electric supply circuit having a current carrying supply wire originating and extending from said terminal box;
   at least one electric heating element for heating work components connected to said electric supply circuit to receive the electrical current;
   a device for supervising the function of said at least one electric heating element, said device comprising:
   a cable gland attached to said terminal control box through which said at least one current supply wire of said electric supply circuit passes;
   an induction coil within said cable gland in proximity to said current carrying supply wire to sense current in said supply circuit; and
   an indicator circuit comprising a light emitting diode connected to said induction coil for detecting and indicating a voltage induced in said induction coil by the current flowing in said current carrying supply wire of said electric supply circuit of a said at least one heating element.

2. A road finisher according to claim 1 wherein said at least one electric heating element is operated with alternating electrical current or with a three-phase electrical current, and said supervising device further comprises a rectifier circuit in which said light emitting diode is connected.

3. A road finisher according to claim 1 wherein said supervising device further comprises a measuring instrument.

4. A road finisher according to claim 1 wherein only one said heating element is connected in said electric circuit.

5. A road finisher according to claim 1 wherein there are a plurality of said electric supply circuits originating from said terminal box each being connected to a respective heating element, and a respective supervising device induction circuit for each said electric supply circuit and its corresponding heating element.

6. A road finisher according to claim 1, wherein said light emitting diode is mounted on said terminal box.

7. A road finisher according to claim 1 further comprising a pair of said cable glands mounted to said terminal box, a respective current supply line passing through each of said cable glands to supply current to a respective heating element, an induction coil located in each said cable gland and a said indicator circuit connected to each said induction coil.

8. A road finisher according to claim 1 wherein said cable gland is screwed into said terminal box.

9. A road finisher according to claim 5 further comprising a plurality of cable glands attached to said terminal box and one of said electric supply circuits passing through a respective cable gland, and the induction coil of a said supervising device located in a said cable gland.

* * * * *